(12) United States Patent
Liu et al.

(10) Patent No.: US 11,817,750 B2
(45) Date of Patent: Nov. 14, 2023

(54) PLANAR POWER MODULE WITH HIGH POWER DENSITY PACKAGING

(71) Applicant: GM GLOBAL TECHNOLOGY OPERATIONS LLC, Detroit, MI (US)

(72) Inventors: Ming Liu, Troy, MI (US); Anthony M. Coppola, Rochester Hills, MI (US); Muhammad H. Alvi, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 402 days.

(21) Appl. No.: 17/149,152

(22) Filed: Jan. 14, 2021

(65) Prior Publication Data
US 2022/0224206 A1 Jul. 14, 2022

(51) Int. Cl.
*H02K 11/33* (2016.01)
*H01L 25/07* (2006.01)
(Continued)

(52) U.S. Cl.
CPC ............ *H02K 11/33* (2016.01); *B60L 50/60* (2019.02); *H01L 23/3107* (2013.01); *H01L 23/34* (2013.01); *H01L 23/3735* (2013.01); *H01L 23/473* (2013.01); *H01L 23/50* (2013.01); *H01L 25/072* (2013.01); *H02K 7/006* (2013.01); *H02K 11/0094* (2013.01); *B60L 2210/40* (2013.01); *B60L 2220/10* (2013.01)

(58) Field of Classification Search
CPC .... H02K 11/33; H02K 11/0094; H02K 7/006; H01L 23/3107; H01L 23/34; H01L 23/3735; H01L 23/473; H01L 23/50; H01L 23/3121; H01L 23/051; H01L 23/49531; H01L 23/49562; H01L 23/49575; H01L 23/49811; H01L 23/46; H01L 25/07218; B60L 50/60; B60L 15/007; B60L 2210/40; B60L 2220/10; H02M 1/327; H02M 1/088; H02M 7/003; H02M 7/53871; H02M 7/5387
See application file for complete search history.

(56) References Cited

U.S. PATENT DOCUMENTS 11,267,366 B2 * 3/2022 Wang .................... B60L 15/007
11,271,492 B2 * 3/2022 Ravi .................... H02M 7/5387
(Continued)

*Primary Examiner* — Emily P Pham
(74) *Attorney, Agent, or Firm* — Quinn IP Law

(57) ABSTRACT

A planar power module includes a second substrate arranged parallel to a first substrate, with the substrates respectively having a dielectric layer interposed between two conductive layers, such that one of the conductive layers of each substrate together forms parallel external conductive surfaces of the power module. The power module includes direct current (DC) bus bars, alternating current (AC) bus bars, and semiconductor switching dies arranged between the substrates. The dies are electrically connected to the bus bars, with each respective die electrically connected to a conductive layers of the first or second substrates. A polymer molding material partially surrounds the substrates and the switching dies. An electric powertrain system includes an electric machine, a propulsion battery pack, and a traction power inverter module (TPIM) having the power module. The power module is a three-phase full-bridge inverter circuit. An electric powertrain and motor vehicle use the power module.

20 Claims, 7 Drawing Sheets

(51) Int. Cl.
_H01L 23/31_ (2006.01)
_H01L 23/34_ (2006.01)
_H01L 23/373_ (2006.01)
_H01L 23/50_ (2006.01)
_H02K 7/00_ (2006.01)
_H02K 11/00_ (2016.01)
_B60L 50/60_ (2019.01)
_H01L 23/473_ (2006.01)

(56) References Cited

U.S. PATENT DOCUMENTS

| | | | |
|---|---|---|---|
| 2006/0152085 A1* | 7/2006 | Flett | H02M 7/003 |
| | | | 307/75 |
| 2022/0199483 A1* | 6/2022 | Debbadi | H01L 23/367 |

* cited by examiner

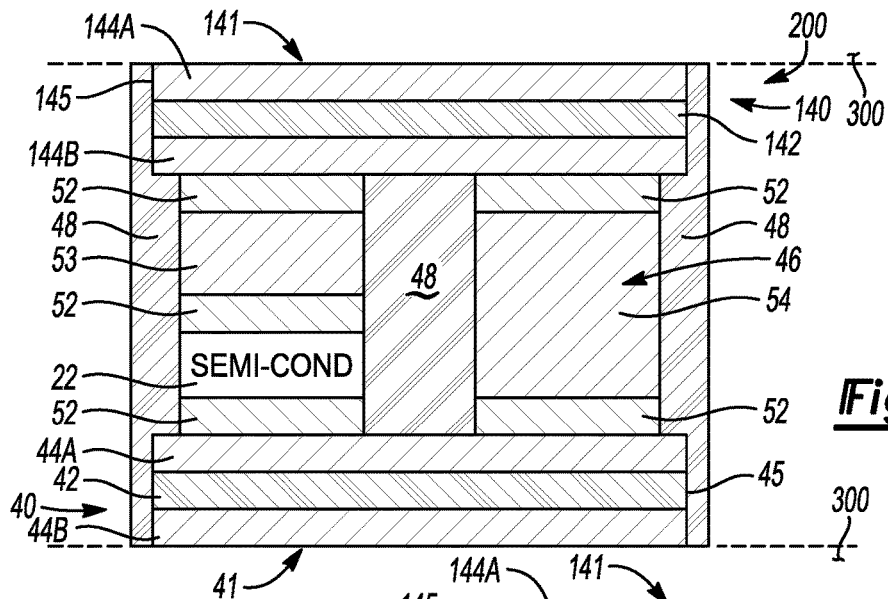
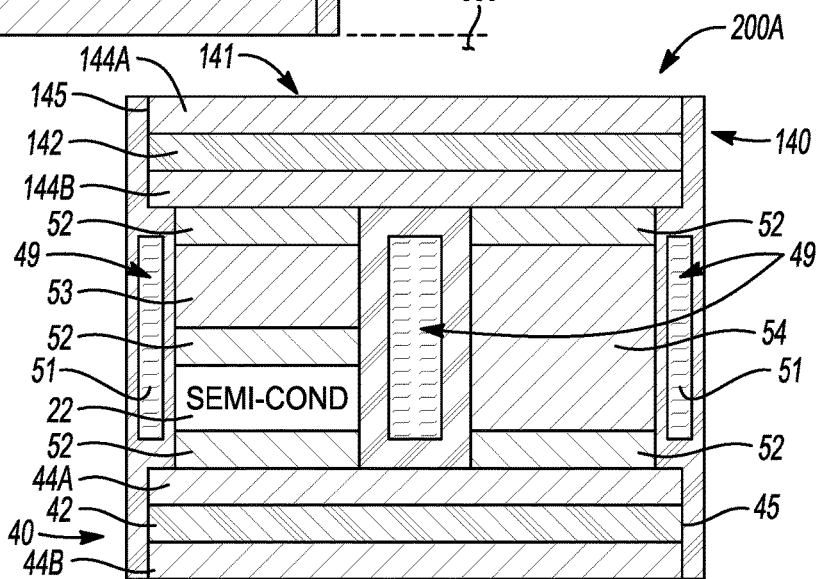
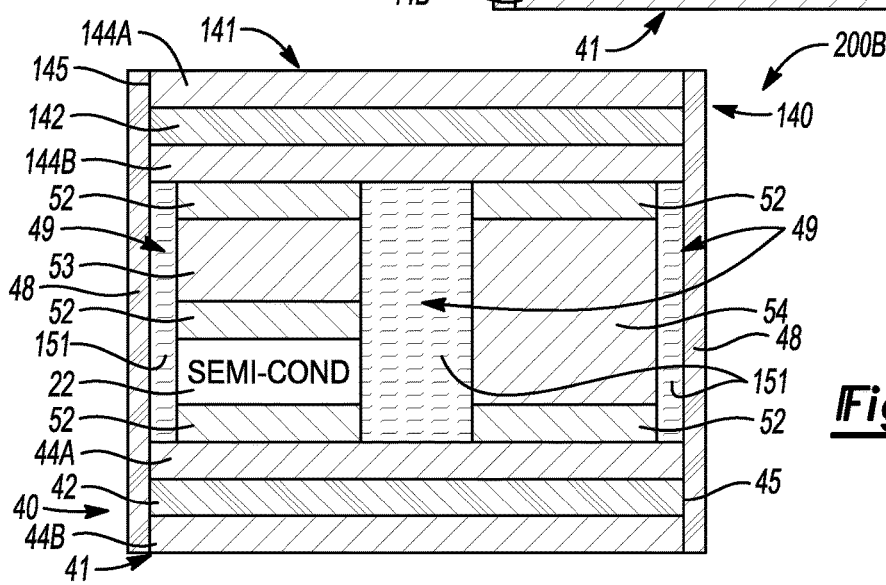

PLANAR POWER MODULE WITH HIGH POWER DENSITY PACKAGING

INTRODUCTION

The present disclosure relates to systems and methods for constructing a power module with condensed packaging and a relatively high power density, with an exemplary power module being a power inverter for use in converting a direct current (DC) voltage to an alternating current (AC) voltage, or vice versa, in a high-voltage electrical system. In an onboard electrical system of an electric vehicle, for instance, high-speed semiconductor switching and filtering operations are used to convert a DC input voltage, typically from a high-voltage propulsion battery pack and DC voltage bus, to an AC output voltage suitable for energizing stator field windings of the electric machine. In a bi-directional inverter embodiment, an AC input voltage from the electric machine, when operating as an electric generator, is similarly converted into a DC output voltage suitable for storage in electrochemical battery cells of the propulsion battery pack.

As understood in the art, a full-bridge inverter is a particular type of power module commonly used to perform the above-noted AC-to-DC and DC-to-AC conversion functions, with the inverter output precisely controlled using pulse width modulation (PWM) or another application-suitable switching control technique. Throughout the switching control process, individual semiconductor switches residing within the inverter change their respective ON/OFF conductive states at a high rate of speed. This switching operation, when sustained over time, generates substantial amounts of heat. Inverters are therefore typically cooled via circulation of coolant, such as through conductive plates or tubing, to help ensure that the inverter and its constituent semiconductor switches remain within allowable thermal limits.

SUMMARY

The present disclosure pertains to improved packaging solutions that enable construction of a full-bridge inverter as a planar power module having a high power density and flat/planar packaging, with the latter enabling double-sided cooling. The disclosed solutions may be applied as part of an integrated power conversion system, such as in the representative application of a traction power inverter module (TPIM) when used aboard a battery electric vehicle (BEV), a fuel cell vehicle, a hybrid electric vehicle (HEV), or another mobile electrified platform. As described herein, the generally planar structure of the disclosed power module and its optional internal cooling features, possibly aided by temperature sensing in the various embodiments, help to efficiently remove generated heat during ongoing operation of the power module.

That is, the planar construction described herein allows for double-sided direct cooling, e.g., by sandwiching the planar power module between external conductive cooling plates of a double-sided cooling system. Such direct cooling may be further optimized using internal coolant passages as described herein. Additionally, the packaging solutions reduce the overall footprint of the power module relative to state-of-the-art designs while providing improved thermal management. The disclosed circuit topologies and integral cooling and temperature sensing features likewise enable higher performance semiconductor switches to be used within the power module, e.g., wide band gap (WBG) devices, which further enables construction of power modules having the increased power density noted above.

According to an exemplary embodiment of the power module, which as noted above is usable with a double-sided direct cooling system, the power module includes parallel first and second substrates. The substrates have respective dielectric layers interposed between conductive layers. The power module also includes DC bus bars, AC bus bars, and a plurality of semiconductor switching dies. The respective switching dies, which contain one or more MOSFETs, IGBTs, thyristors, diodes, or other semiconductor switches, and are arranged between the substrates and electrically connected to the DC and AC bus bars. Each respective die is electrically connected to a conductive layer of the first or second substrate.

A suitable polymer molding material such as epoxy surrounds edges substrates and the semiconductor switching dies to form a dielectric support structure, leaving external surfaces of the conductive layers exposed as main surfaces of the power module. The power module is configured as a full-bridge inverter circuit in the described embodiments.

A first temperature sensor may be connected to an external conductive surface of the first substrate, while a second temperature sensor may be similarly connected to the external conductive surface of the first substrate or the second substrate. Other embodiments may include more temperature sensors as needed. The temperature sensors in some configurations include respective pairs of conductive, e.g., copper, meander resistor traces built on or etched onto the external surface(s). The meander resistor traces in such an embodiment are electrically connected to a respective pair of temperature sensing pins.

The respective external conductive surfaces of the first and second substrates are constructed in a non-limiting embodiment from direct bond copper (DBC), in which case the meander resistor traces are etched directly onto the DBC.

In some configurations, the power module defines internal coolant passages in proximity to the semiconductor switching dies, e.g., a network of coolant passages routed around or surrounding a perimeter of each of the various dies. In a non-limiting implementation, such coolant passages are formed or defined within the polymer molding material noted above, such that coolant passing through the coolant passages does not directly contact the semiconductor switching dies. In other embodiments, an electrical coolant may be used to enable direct contact with the semiconductor switching dies and the conductive layers, in which case the coolant passages may be open to the dies and conductive layers.

The internal coolant passages may have different diameters. The use of different diameters would help provide a more even flow rate of the coolant through the power module.

In an aspect of the disclosure, one or more of the semiconductor switching dies may optionally include multiple semiconductor dies arranged in parallel or series, with or without a diode, to form a single switch.

An electric powertrain system is also disclosed herein. In an exemplary embodiment, the electric powertrain system includes a polyphase rotary electric machine having phase windings and an output member, a battery pack, and a traction power inverter module (TPIM). The TPIM, which is connected to the battery pack and to the phase windings, includes the planar power module. In this particular embodiment, the planar power module is internally cooled and constructed as a three-phase, full-bridge inverter circuit.

Also disclosed herein is a motor vehicle having road wheels, a three-phase electric traction motor having phase windings and an output member coupled to at least one of the road wheels, a propulsion battery pack, and a TPIM. The TPIM is connected to the propulsion battery pack and to the phase windings, and includes a double-sided cooling system and a planar power module positioned therewithin, with the power module being constructed as the above-noted three-phase full-bridge inverter circuit. A polymer molding material of the power module, which surrounds the dies and the first and second substrates as described above, defines internal coolant passages in proximity to the semiconductor switching dies.

The above summary does not represent every embodiment or every aspect of this disclosure. Rather, the above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes combinations and sub-combinations of the elements and features presented above and below.

BRIEF DESCRIPTION OF THE DRAWINGS

FIGS. 5A, 5B, and 5C are schematic cross-sectional side view illustrations of the power modules shown in FIGS. 2-4B in accordance with different embodiments.

DETAILED DESCRIPTION

Figure 1:
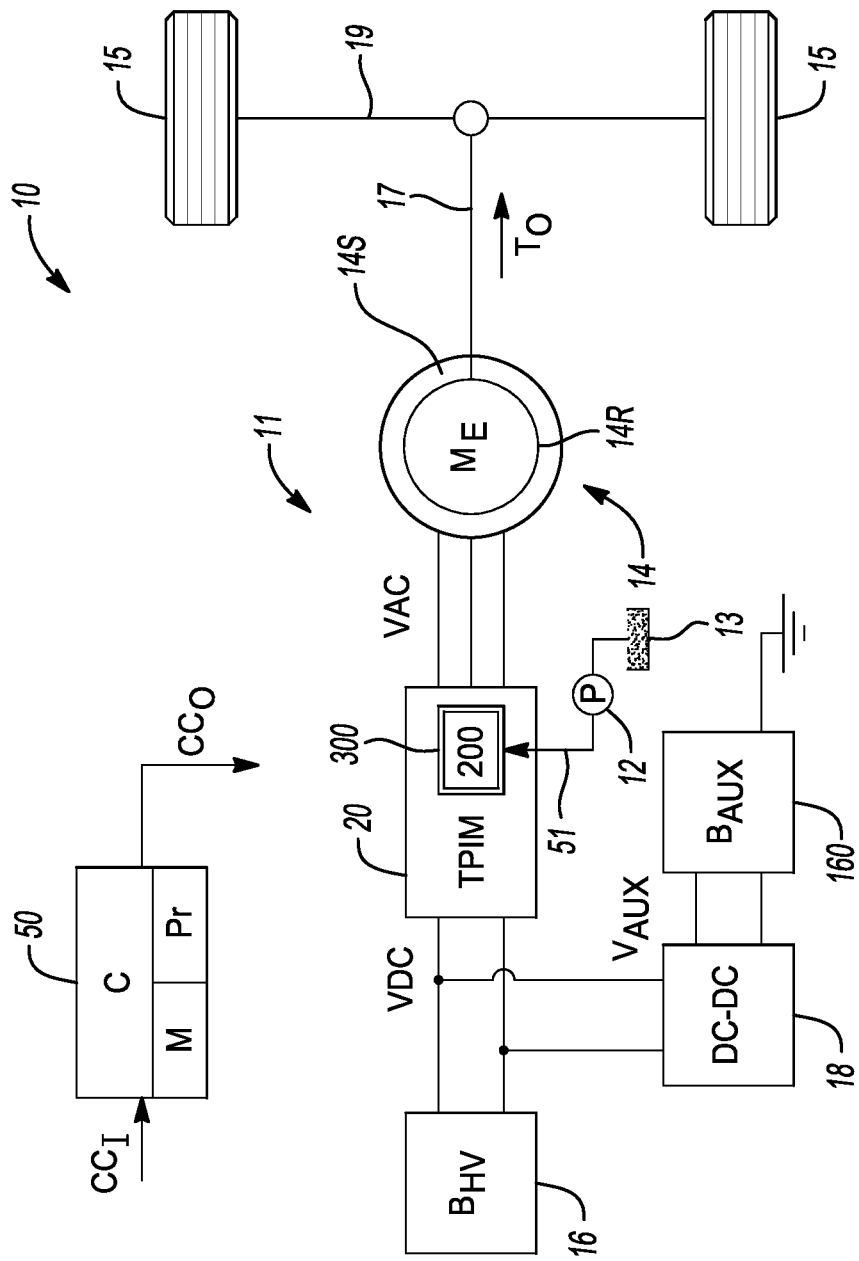
FIG. 1 is a schematic perspective view of a representative electrical system having an internally cooled power module configured as a full-bridge inverter circuit and thus usable as part of a traction power inverter module (TPIM), with the power module constructed in accordance with the present disclosure.

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, "any" and "all" shall both mean "any and all", and the words "including", "containing", "comprising", "having", and the like shall mean "including without limitation". Moreover, words of approximation such as "about", "almost", "substantially", "generally", "approximately", etc., may be used herein in the sense of "at, near, or nearly at", or "within 0-5% of", or "within acceptable manufacturing tolerances", or logical combinations thereof.

Referring to FIG. 1, a motor vehicle 10 includes an electric powertrain system 11, the latter of which is inclusive of a generally flat or planar power module 200, which is internally cooled and constructed as a three-phase full-bridge inverter circuit in accordance with the present disclosure. While the motor vehicle 10 and the electric powertrain system 11 are representative of a type of electrified system in which the power module 200 may be used, the present teachings are not limited to mobile systems in general or to vehicular applications in particular. Rather, the power module 200 may be used in other electrical systems, whether mobile or stationary, in which compact/high power density packaging and direct double-sided cooling would be beneficial. Exemplary applications include, without limitation, watercraft, aircraft, robots, conveyor equipment, power stations, and the like. However, for illustrative consistency and solely for illustrating the present teachings, the power module 200 will be described below in the context of the motor vehicle 10.

The electric powertrain system 11 contemplated herein includes at least one polyphase electric machine ($M_E$) 14 having a stator 14S and a rotor 14R, the latter of which is coupled to an output member 17. When the electric machine 14 is energized via a high-voltage direct current (DC) battery pack ($B_{HV}$) 16 or another DC voltage supply, the electric machine 14 generates output torque (arrow $T_O$), which in turn is delivered to a coupled driven load via the output member 17. In the representative vehicular embodiment of FIG. 1, for instance, such a driven load includes a set of road wheels 15 and one or more drive axles 19.

When the electric machine 14 is configured as a polyphase/alternating current (AC) device as shown, energization of the electric machine 14, or more precisely windings of the stator 14S thereof, involves a carefully controlled high-speeding switching control of a traction power inverter module (TPIM) 20. That is, during a typical DC-to-AC conversion process, a DC input voltage (VDC) is provided by the battery pack 16 to the TPIM 20. Pulse-width modulation (PWM) or other high-speed switching operations of the TPIM 20 provided in response to switching control signals (arrow $CC_O$) from an onboard controller (C) 50 provides an AC output voltage (VAC) to the stator 14S. In a bi-directional embodiment of the TPIM 20, the reverse process is used to convert an AC voltage from the electric machine 14, in this case an AC input voltage, to a DC output voltage for charging constituent battery cells (not shown) of the battery pack 16.

With respect to the controller 50, such a device or several networked computer devices include memory (M) and one or more processors (Pr). In response to input signals (arrow $CC_I$) from various sensors (not shown) and/or other electronic control units of the motor vehicle 10, the controller 50 generates the switching control signals (arrow $CC_O$) noted above, among other possible control signals. That is, the controller 50 may receive inputs such as an operator's torque request, braking request, steering inputs, ambient and specific component temperatures, etc., and may thereafter determine appropriate drive parameters for powering the electric machine 14. Although the controller 50 is depicted schematically as a unitary box in FIG. 1 for illustrative clarity and simplicity, the controller 50 could include one or more networked devices each with a central processing unit or another processor (Pr) and sufficient amounts of memory (M), including a non-transitory (e.g., tangible) medium that participates in providing data/instructions that may be read by the processor (Pr).

Other components may be included in the construction of the electric powertrain system 11 of FIG. 1, including a DC-DC converter 18 and a low-voltage/auxiliary battery ($B_{AUX}$) 160. Thus, when 12-15V auxiliary voltage levels ($V_{AUX}$) are required aboard the motor vehicle 10, with the battery pack 16 being a propulsion battery pack having a voltage capability of 300V or more in some configurations, such voltages may be provided via operation of the DC-DC converter 18, as is well understood in the art.

With respect to the power module 200 possibly residing within the TPIM 20 in the illustrated configuration, this component is constructed as set forth herein to enable construction of a three-phase, full-bridge inverter with compact packaging, high power density, integral internal cooling features, and temperature sensing configurations. The stacked construction of the power module 200 in the various embodiments described herein has the effect of concentrating internally generated heat from switching operations into a smaller than typical volume. The double-sided planar configuration of the power module 200, however, lends itself to direct double-sided cooling via a double-sided cooling system 300 as explained below. In general, a pump (P) 12 may be operated to circulate coolant 51 from a sump 13, with the coolant 51 passing through the power module 200 in some embodiments, and/or through the double-sided cooling system 300 in other embodiments. The beneficial increase in power density, double-sided cooling, and other disclosed features collectively enable construction of higher performance components, and ultimately provides improved thermal management relative to existing circuit topologies.

Figure 1A:
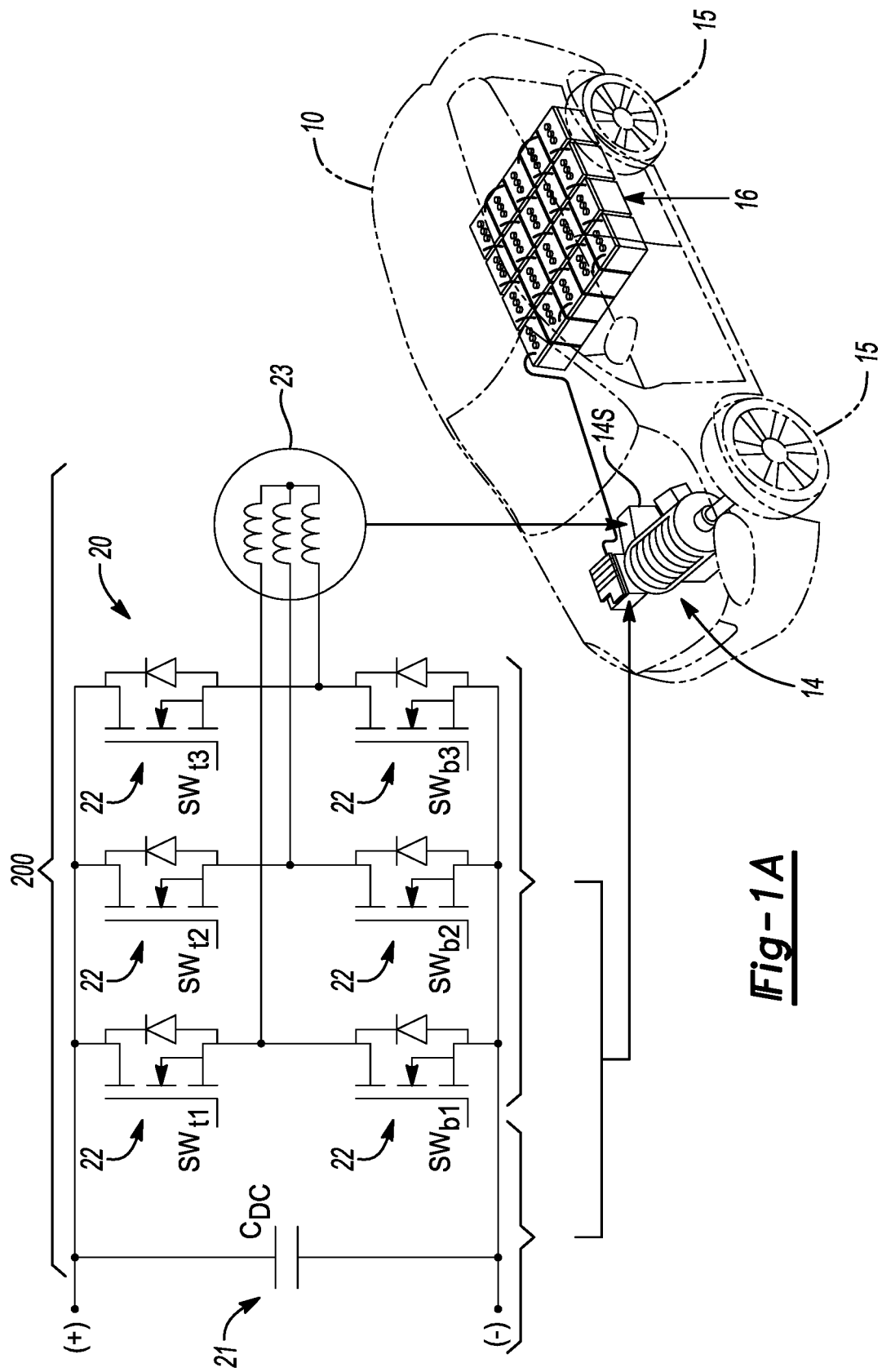
FIG. 1A is a schematic circuit topology of an exemplary three-phase inverter circuit usable as part of the TPIM within the electrical system shown in FIG. 1.

Referring briefly to FIG. 1A, the TPIM 20 includes a DC link capacitor ($C_{DC}$) 21 and a plurality of semiconductor switching dies 22. Nominally, the semiconductor switching dies 22 are arranged in top and bottom locations as set forth herein, with each phase of the polyphase/AC electric machine 14 shown in FIG. 1 thus having a top/high/positive and bottom/low/negative switching pair. The electric machine 14 may be a three-phase device in a typical embodiment, in which case the TPIM 20 would include three phase legs. For each phase leg, with the semiconductor switching dies 22 labeled $SW_{t1}$, $SW_{t2}$, $SW_{t3}$, $SW_{b1}$, $SW_{b2}$, and $SW_{b3}$ configured as exemplary MOSFETs shown, the high-side switches $SW_{t1}$, $SW_{t2}$, $SW_{t3}$ and the low side switches $SW_{b1}$, $SW_{b2}$, and $SW_{b3}$ are connected to the DC-side of the illustrated TPIM 20, as appreciated in the art. The AC side in this particular arrangement is thus taken from the middle of the high-side and low-side switches $SW_{t1}$, $SW_{t2}$, $SW_{t3}$, $SW_{b1}$, $SW_{b2}$, and $SW_{b3}$ as shown. While the non-limiting six-switch embodiment of FIG. 1A may be used to implement a three-phase full-bridge inverter as shown, it is also possible to implement the present teachings with a different number of semiconductor switching dies 22, such as but not limited to a twelve-switch six-phase embodiment.

Figure 2:
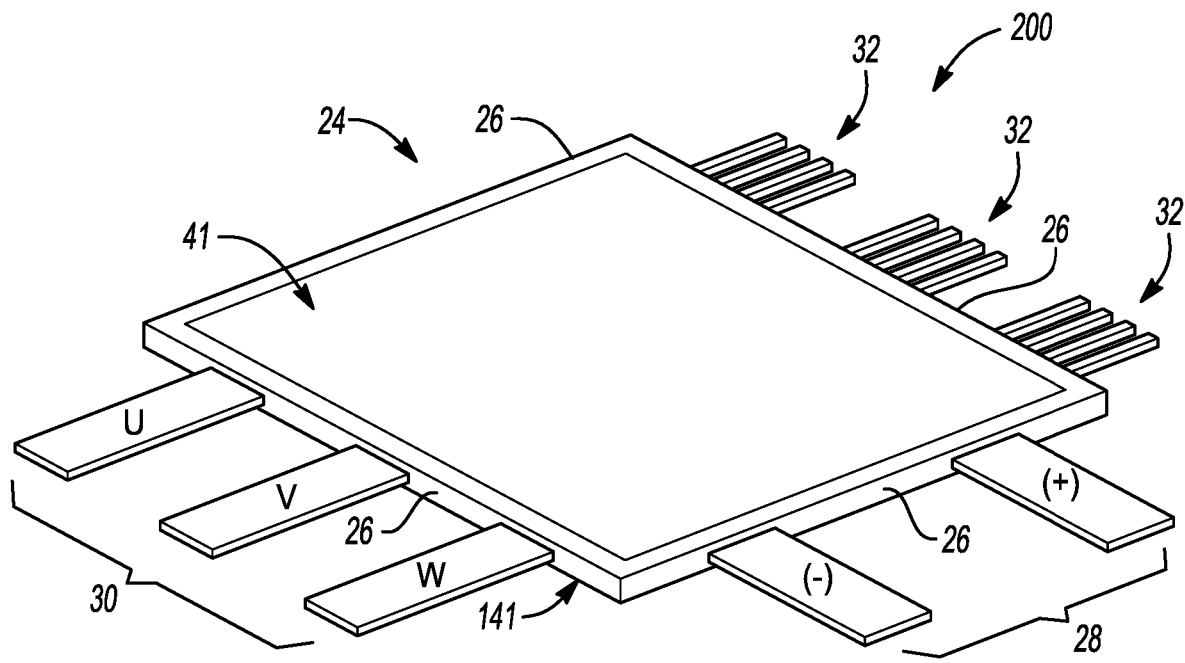
FIG. 2 is a schematic perspective view illustration of a representative power module constructed in accordance with the present disclosure.

Referring to FIG. 2, an exemplary perspective view is provided of a possible embodiment of the power module 200 described herein. As noted above with reference to FIG. 1A, the power module 200 contains the semiconductor switching dies 22 in a double-sided stack up, with such a circuit topology shown in FIGS. 4A-8 and explained in detail below. In order to support such structure in a compact planar package as shown, the power module 200 includes an edge support structure 24 constructed of a thermally-conductive dielectric polymer material, such as an application suitable grade of plastic. The edge support structure 24 may be rectangular or square as shown, with its cage-like structure exposing opposing external conductive surfaces 41 and 141 and four lateral surfaces 26 extending therebetween. A periphery of the external conductive surfaces 41 and 141 may be perforated to include perimeter cooling passages (not shown) that are collectively configured to admit the coolant 51 of FIG. 1 in some embodiments.

Protruding from the lateral surfaces 26 are conductive DC bus bars 28 (+, -) and conductive AC bus bars 30 nominally labeled U, V, and W. The DC bus bars 28 and the AC bus bars 30 may be constructed of copper, aluminum, or another suitable electrically conductive material. Also visible from the perspective of FIG. 2, gate control pins 32 are used to control the ON/OFF switching operation of the resident semiconductor switching dies 22 of FIG. 2 located within the power module 200, as appreciated in the art. Such gate control pins 32 are connected to the controller 50 of FIG. 1, via a gate driver (not shown), to enable voltage control signals to be transmitted to the gates of the individual semiconductor switching dies 22 when controlling a duty cycle thereof.

Figure 3:
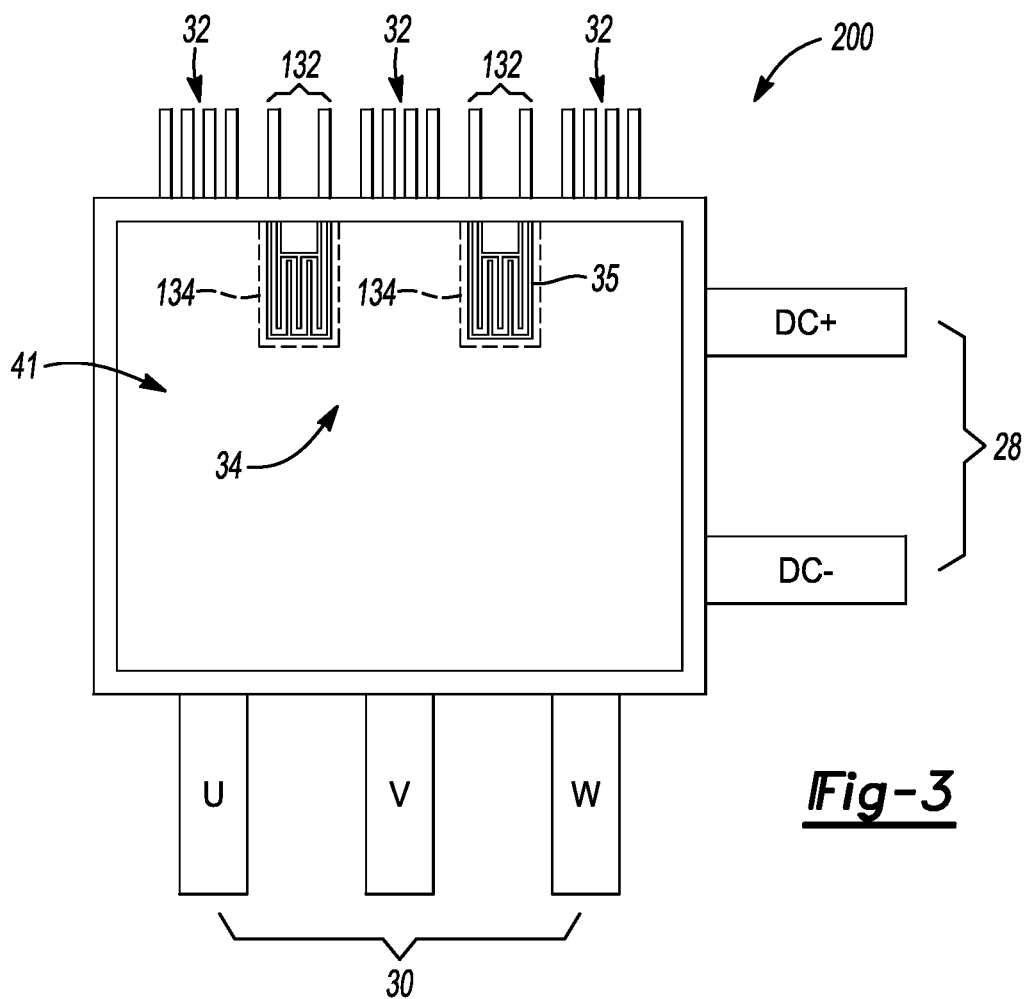
FIG. 3 is a schematic plan view illustration of the power module shown in FIG. 2.

As shown in FIG. 3, embodiments of the power module 200 include one or more temperature sensors 34 configured to measure a corresponding temperature of the particular external conductive surface 41 or 141. As the power module 200 is internally cooled, flow of coolant 51 may be controlled in a feedback loop using measured temperatures from such temperature sensors 34. While the external conductive surface 41 is visible from the perspective of FIG. 3, similarly configured temperature sensors 34 may be arranged on the external conductive surface 141 located diametrically opposite the external conductive surface 41.

As shown, the temperature sensors 34 may include a respective pair of conductive meander resistor traces 134, e.g., copper traces, which may be etched on the external conductive surface 41 and 141. Each one of the copper meander resistor traces 134 is electrically connected to a respective pair of temperature sensing pins 132 and coated with a dielectric material 35. In a non-limiting exemplary embodiment, the external conductive surfaces 41 and 141 may be embodied as direct bond copper (DBC), with the copper meander resistor traces 134 possibly being etched onto the DBC, on either the outer or inner layers thereof relative to the location of the power module 20. Internal construction of the power module 200 will now be described with reference to the remaining Figures.

Figure 4A:
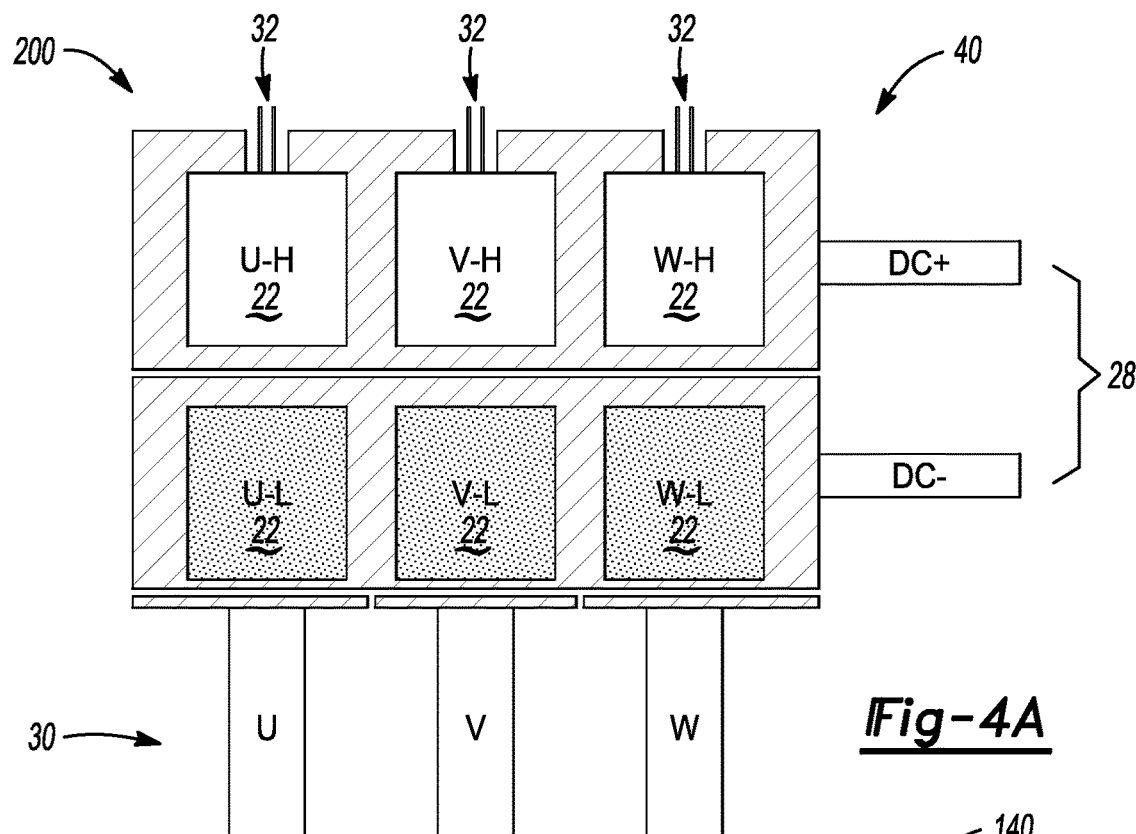
FIGS. 4A and 4B are schematic cross-sectional illustrations of respective first/bottom and second/top substrates of the power module depicted in FIGS. 2 and 3.
Figure 4B:
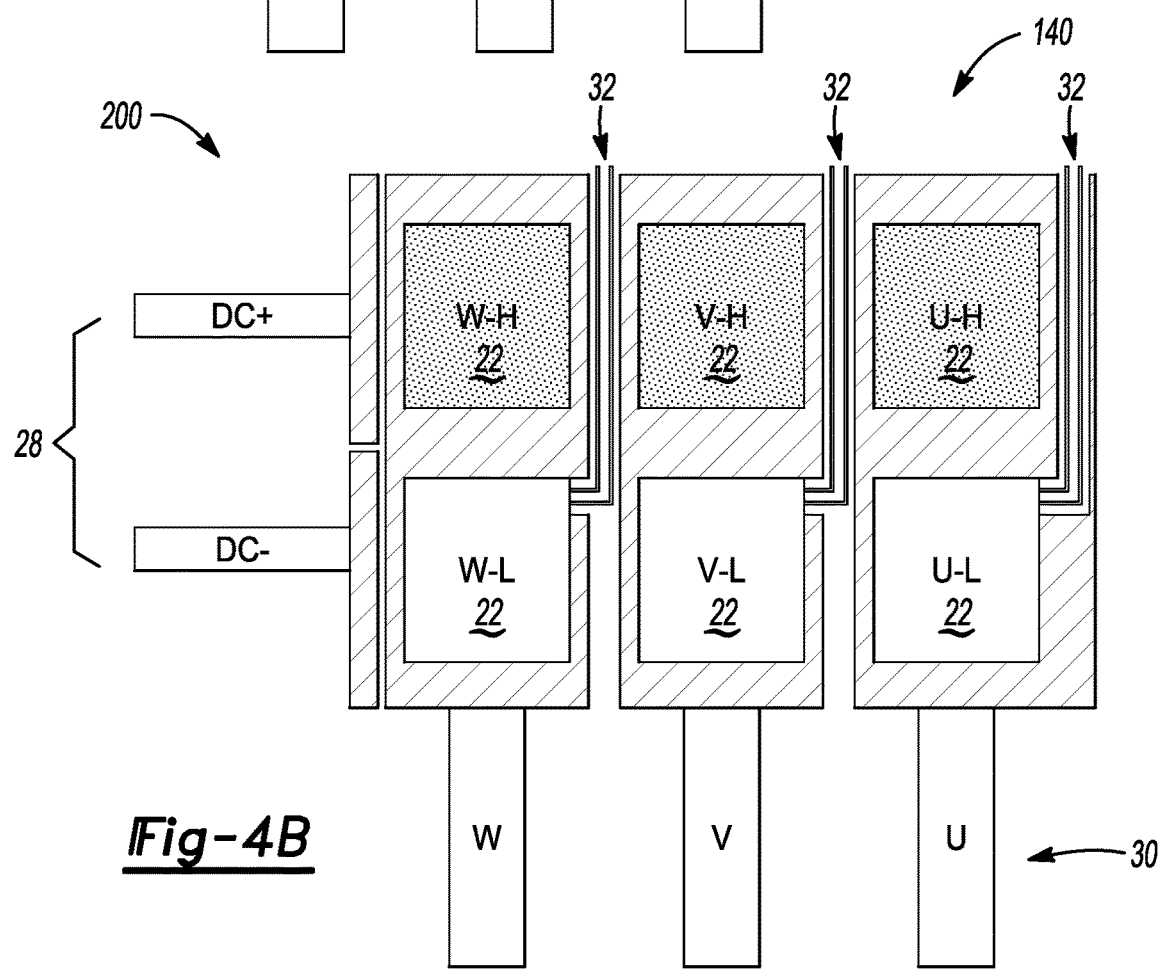

THREE-PHASE FULL-BRIDGE INVERTER: FIGS. 4A and 4B respectively depict schematic plan view illustrations of a lower/bottom substrate 40 and an upper/top substrate 140 of the power module 200 shown in FIGS. 2 and 3. The illustrated topology enables construction of a representative three-phase full-bridge "6-in-1" power module 200, in which six semiconductor switching dies 22 are electrically connected to the DC bus bars 28 and the AC bus bars 30, with the bus bars 28 and 30 together providing a simplified five-terminal topology.

With respect to the lower/bottom substrate 40 of FIG. 4A, the high/positive semiconductor switching dies 22 are labeled U-H, V-H, and W-H for the nominal U, V, and W phases. The low/negative semiconductor switching dies 22 are labeled U-L, V-L, and W-L for the same nominal U, V, and W electrical phases. The top substrate 140 of FIG. 4B is flipped relative to the orientation of the bottom substrate 40 of FIG. 4A. In both Figures, the shaded background of certain semiconductor switching dies 22 indicates a source-side of the respective dies, while an unshaded background indicates a drain/collector side. That is, the dies 22 labeled U-H, VH and WH are oriented such that drain is facing up, while the dies 22 labeled UL, VL, WL have their sources facing up.

Internal cooling construction usable with the exemplary circuit topology of FIGS. 4A and 4B is shown in the cross-sectional illustrations of FIGS. 5A-C, which depict the power module 200 as different planar circuit assemblies, i.e., power modules 200, 200A, and 200B. The embodiments of FIGS. 5A-C each include the bottom substrate 40 and the top substrate 140. As "top" and "bottom" are relative terms, and the orientation of the power module 200 could change in different applications, the term top substrate 140 is hereinafter referred to as second substrate 140, with the bottom substrate 40 hereinafter referred to as a first substrate 40.

The second substrate 140 includes a second dielectric layer 142 interposed between a second pair of conductive layers, i.e., conductive layers 144A and 144B. An external conductive surface 141 of the second pair of conductive layers 144A and 144B forms a second external conductive surface of the power module 200. The similarly constructed first substrate 40 has a first dielectric layer 42 interposed between a first pair of conductive layers, i.e., conductive layers 44A and 44B. An external conductive surface 41 of the power module first pair of conductive layers 44A and 44B is parallel to the second external conductive surface, i.e., external conductive surfaces 41 and 141 are parallel to each other.

Figure 6:
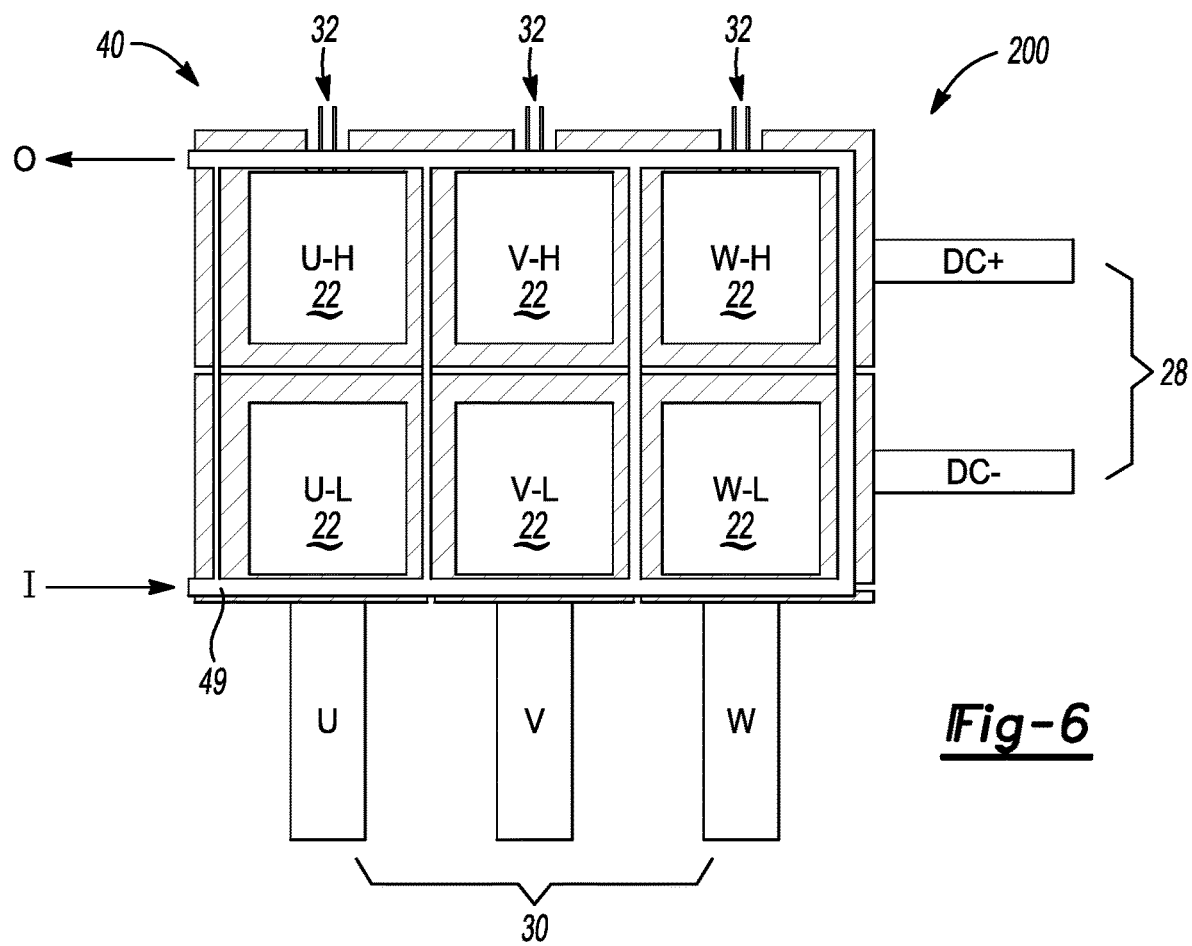
FIG. 6 is a schematic cross-sectional plan view illustration of the power module with internal coolant passages in accordance with yet another embodiment.

The respective first and second substrates 40 and 140 each include respective lateral surfaces 45 and 145. The second external conductive surface 141 and the first external conductive surface 41 are configured to be directly cooled by a double-sided cooling system 300, as noted above. The semiconductor switching dies 22 of FIGS. 4A and 4B, abbreviated "SEMI-COND" in FIGS. 5A-5C, are arranged in a cavity 46 between the first substrate 40 and the second substrate 140. Although not visible from the perspective of FIGS. 5A-C, the gate control pins 32 of FIGS. 4A and 4B are electrically connected to each of the semiconductor switching dies 22. Additionally, each of the semiconductor switching dies 22 is electrically connected to the conductive layers 44B and 144B. A polymer molding material 48 partially surrounds the lateral surfaces 45 and 145, i.e., the edges of the power module 200, and at least partially fills the cavity 46 as shown. A portion of the cavity 46 may remain open within the polymer molding material to define internal coolant passages 49 surrounding perimeter edges of the semiconductor switching dies 22 as set forth below, and as depicted in FIGS. 5B, 5C, and 6.

In a possible embodiment, the semiconductor switching dies 22 may be in the form of a bipolar transistor, an insulated-gate bipolar transistor (IGBT), a power metal-oxide-semiconductor field-effect transistor (MOSFET), a thyristor, a diode, or another suitable high-speed semiconductor switching device. The polymer molding material 48 may be constructed from an application-suitable polymeric dielectric material, e.g., an epoxy-based or silicone-based material. Connection of the semiconductor switching dies 22 may be made via die attachment materials 52, possibly using conductive spacers 53 or a lead frame 54, both of which are well understood in the art.

In some embodiments, the first and second substrates 40 and 140 may have a composite structure, e.g., a ceramic substrate sandwiched between and directly bonded to layers or sheets of copper or another electrically conductive metal. Such a metallized ceramic substrate may be in the form of a direct bonded copper (DBC) or a direct bonded aluminum (DBA) ceramic substrate, or active metal brazing (AMB). In either case, the ceramic substrate, i.e., dielectric layers 42 and 142, may be made of a ceramic material such as aluminum-oxide ($Al_2O_3$), aluminum-nitride (AlN), silicon nitride ($Si_3N_4$), and/or beryllium oxide (BeO). In a DBC construction, the ceramic substrate is sandwiched between and directly bonded to layers or sheets of copper (Cu) and/or copper oxide (CuO). In DBA ceramic substrates, the ceramic substrate is sandwiched between and directly bonded to layers or sheets of aluminum (Al), as will be readily appreciated by those skilled in the art.

In addition to the internal cooling described in detail herein, cooling of the power module 200 shown in FIG. 5A may be accomplished from two sides via the double-sided cooling system 300. Such direct two-sided cooling via the double-sided cooling system 300 may be used in conjunction within internal cooling in the alternative embodiments of FIGS. 5B and 5C to provide additional thermal regulation of the power module 200. In such configurations, inserts or sacrificial materials may be used to construct internal coolant passages 49 within the polymer molding material 48. Coolant 51 may be circulated via an external pump (not shown) through the internal coolant passages 49 to remove heat from the power module 200.

The FIG. 5B embodiment, for example, surrounds a periphery of the cavity 46 (see FIG. 5A) and the semiconductor switching dies 22 with the polymer molding material 48 to ensure that the polymer molding material 48 is disposed between the coolant 51 and conductive surfaces of the power module 200, thus allowing for different compositions of the coolant 51. That is, the coolant 51 shown in the FIG. 5B embodiment is prevented from directly contacting the semiconductor switching dies 22 and the conductive layers 44A, 44B, 144A, and 144B, thus enabling use of dielectric coolants as well as conductive coolants. FIG. 5C in contrast places an electrical coolant 151 in direct contact with the semiconductor switching dies 22 and conductive layers 44B and 144B, thus necessitating the use of a dielectric/non-conductive type of coolant.

Referring briefly to FIG. 6, the power module 200 is shown from the same perspective as FIG. 4A, i.e., as the first/bottom substrate 40. The internal coolant passages 49 may be used within the polymer molding material 48 to allow the coolant 51 or 151 of FIGS. 5B and 5C to cool the semiconductor switching dies 22, respectively, with the coolant 151 directly contacting the semiconductor switching dies 22 and other conductive structure. Coolant 51, for instance, may be pumped into the internal coolant passages 49, as indicated by arrow I, with the circulated coolant 51 picking up heat as the coolant 51 flows around the various semiconductor switching dies 22. The heated coolant 51 then exits the power module 200 (arrow O), with heat thereafter removed from the coolant 51 via a heat exchanger (not shown) before being recirculated to the power module 200. In the illustrated embodiment, the coolant inlet and outlet are located diametrically opposite the DC bus bars 28 to facilitate packaging, but can be placed or routed in other ways to improve cooling based on the particular application.

In a possible construction, the internal coolant passages 49 extending toward the gate control pins 32, i.e., vertically from the perspective of FIG. 6, may be made with progressively larger diameters as one moves toward the DC bus bars 28. For instance, the internal coolant passages 49 located in close proximity to the semiconductor switching dies 22 labeled W-H and W-L may be larger in diameter than the internal coolant passages 49 located in close proximity to the semiconductor switching dies 22 labeled U-H and U-L. Such a construction would help even the flow despite the different path lengths. Alternative constructions may use a larger supply and sink channel, as will be appreciated by those skilled in the art.

Figure 7:
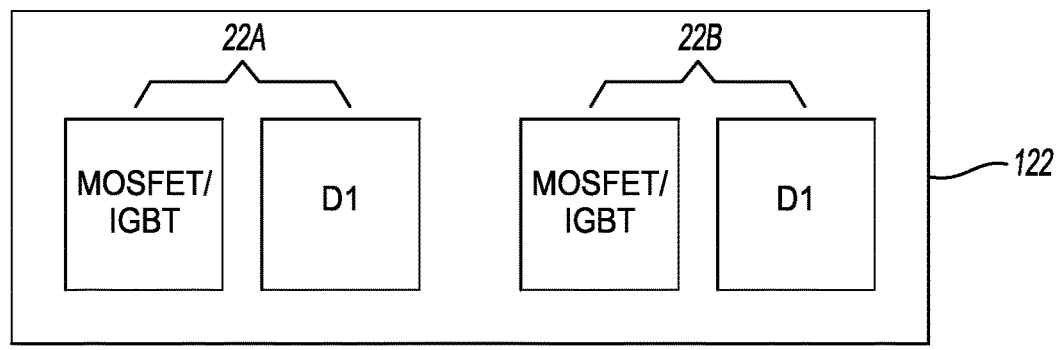
FIG. 7 is a schematic illustration of a possible embodiment of a semiconductor switch implemented using more than one semiconductor switching die.

Referring briefly to FIG. 7, while the power module 200 is described above for simplicity as a representative six-switch device in which each switch includes is implanted as a single semiconductor switching die 22, those skilled in the art will appreciate that other embodiments may be constructed using additional switches per semiconductor switching die 22. For instance, a semiconductor switching die 122 as shown schematically in FIG. 7 may be implemented as two semiconductor switches 22A and 22B, each having a MOSFET or IGBT, and possibly a diode D1. The alternative semiconductor switching die 122 may therefore include multiple semiconductor switches 22A and 22B arranged in parallel or series, with the latter possibly used to form other three phase topologies, such as a current source inverter which requires a MOSFET in series with a diode. Thus, each switch used to construct the power module 200 in its various embodiments may be implemented using a different type and/or number of the semiconductor switching dies 22 within the scope of the disclosure, with the semiconductor switching die 122 of FIG. 7 being representative of a simplified two-switch configuration.

Figure 8:
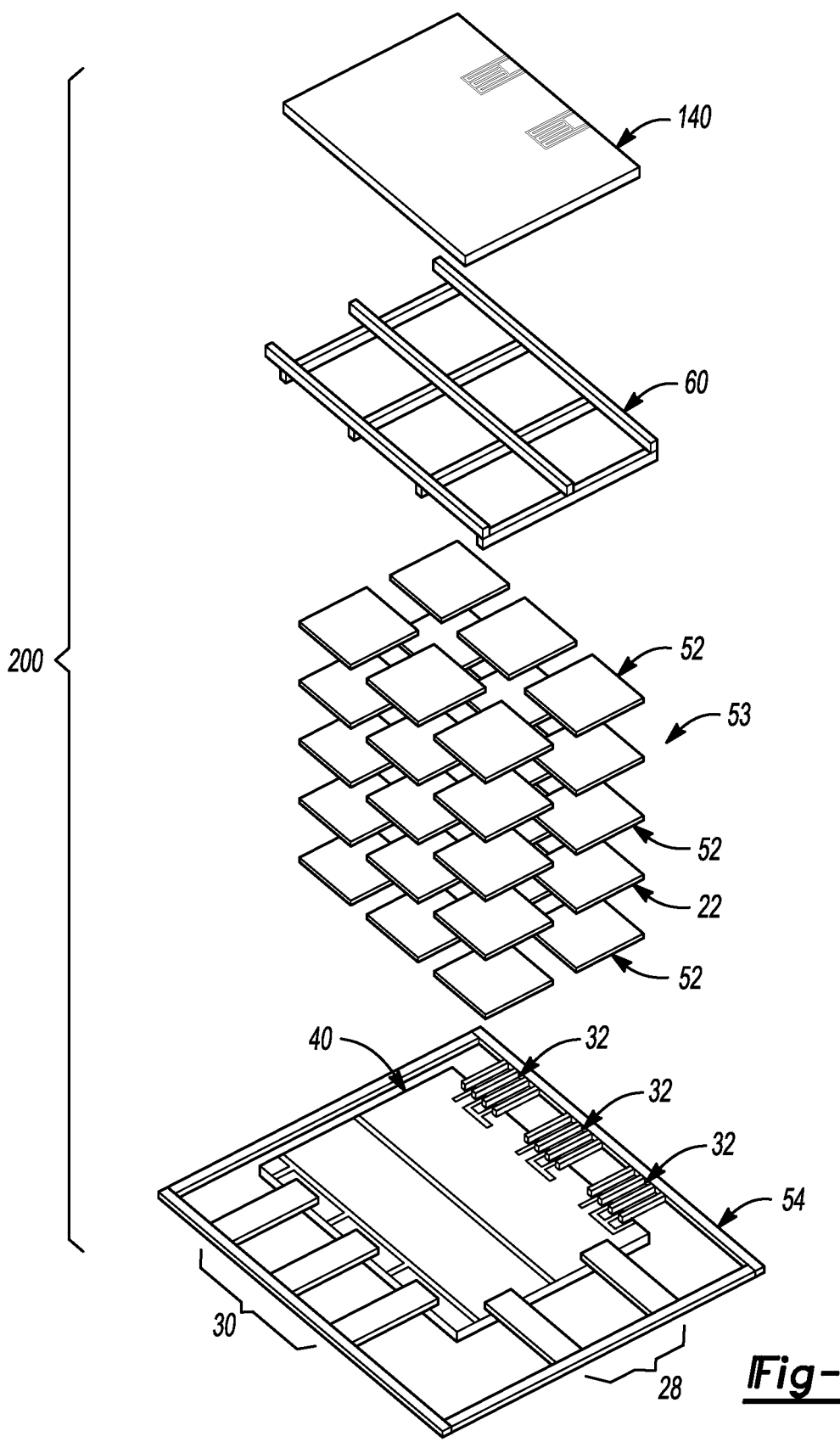
FIG. 8 is a perspective exploded view illustration of the power module described herein.

FIG. 8 depicts the power module 200 of the present disclosure according to a representative construction, with the first and second substrates 40 and 140 sandwiching the die attachment materials 52, conductive spacers 53, and semiconductor switching dies 22 therebetween. To construct the power module 200, one may stack the semiconductor switching dies 22 with the die attachment materials 52 and then mount the semiconductor switching dies 22 with the conductive spacers 53. The semiconductor switching dies 22 and the conductive spacers 53 are then attached to the first and second substrates 40 and 140, with the first substrate 40 connected to the lead frame 54.

At this point, sacrificial materials 60 may be applied with a predefined pattern, with various examples of the sacrificial materials 60 explained below. For simplicity, the sacrificial materials 60 are shown on one plane, but would fill voids or openings that are not otherwise filled by other structure or materials. The second substrate 140 is then attached. Thereafter, the polymer molding materials 48, not shown in FIG. 8 but depicted in FIGS. 5A-5C, are applied to encapsulate the illustrated components of the power module 200. The lead frame 54 is thereafter trimmed to form the DC bus bars 28 and the AC bus bars 30, along with the gate control pins 32. Thereafter, the sacrificial materials 60 are removed to form the internal coolant passages 49 of FIG. 6.

As part of a manufacturing method, the sacrificial materials 60 may be introduced by compression molding, vacuum forming, thermoforming, injection molding, blow molding, profile extrusion, or a combination of such techniques. In some embodiments, the sacrificial materials 60 may be introduced in the form of a liquid or relatively soft material and allowed to solidify or harden by cooling and/or by curing. The sacrificial materials 60 are of a type easily removed without harming the physical and/or structural integrity of the other components of the power module 200. In some embodiments, the sacrificial material 60 may be a material that exhibits a solid phase at ambient temperature, but transitions to a liquid phase or a gas phase upon heating to a temperature less than 175° C. The sacrificial materials 60 additionally or alternatively may be a material that exhibits a solid phase at ambient temperature, but thermally decomposes (e.g., pyrolyzes or oxidizes) upon heating to a temperature greater than ambient temperature but less than 175° C. In other embodiments, the sacrificial materials 60 may be soluble in an aqueous medium (e.g., water) or a nonaqueous medium (e.g., acetone), or a material that can be dissolved by a chemical etchant (e.g., an acid such as hydrochloric acid, sulfuric acid, and/or nitric acid).

In terms of acceptable materials of construction, the sacrificial materials 60 may be embodied as polyethylene carbonate, polypropylene carbonate, polypropylene/cyclohexene carbonate, polycyclohexene carbonate, or polybutylene carbonate material in different non-limiting exemplary embodiments. Such materials are configured to depolymerize at relatively low temperatures, which could be further lowered by the addition of an appropriate catalyst, e.g., tetra(n-butyl) ammonium acetate or a photo-acid generator. Combustible compounds may also be used to construct the sacrificial materials 60.

Regardless of the number and type of semiconductor switching dies 22 used to construct the power module 200 of the present disclosure, the present teachings enable double-sided direct cooling of a planar construction, e.g., of a full-bridge electrical topology using five terminals. Cooling may be enhanced using the internal coolant passages 49 described above and shown in FIGS. 5B, 5C, and 6. Using the forgoing teachings, one may greatly increase the available power density of power electronics using power modules 200 constructed of a reduced size relative to competing technologies. These and other benefits will be readily appreciated by those skilled in the art in view of the forgoing disclosure.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. Moreover, this disclosure expressly includes combinations and sub-combinations of the elements and features presented above and below.

What is claimed is:
1. A planar power module comprising:
a first substrate;
a second substrate arranged parallel to the first substrate, wherein the first substrate and the second substrate each respectively have a dielectric layer interposed between two conductive layers, such that one of the two conductive layers of each of the first substrate and the second substrate together form parallel external conductive surfaces of the planar power module;
direct current (DC) bus bars;
alternating current (AC) bus bars;
a plurality of semiconductor switching dies arranged between the first substrate and the second substrate, and electrically connected to the DC bus bars and the AC bus bars, wherein each respective one of the semiconductor switching dies is electrically connected to the two conductive layers of the first substrate or the second substrate; and
a polymer molding material surrounding edges of the first substrate, the second substrate, and the plurality of semiconductor switching dies, wherein the planar power module is configured as a full-bridge inverter circuit.

2. The planar power module of claim 1, further comprising: at least one temperature sensor connected to a respective one of the two conductive layers of the first substrate and/or the second substrate.

3. The planar power module of claim 2, wherein the at least one temperature sensor includes a first temperature sensor connected to a first one of the parallel external conductive surfaces, and a second temperature sensor connected to a second one of the parallel external conductive surfaces.

4. The planar power module of claim 3, further comprising: temperature sensing pins, wherein the first temperature sensor and the second temperature sensor each includes a respective pair of copper meander resistor traces, and wherein the respective pair of copper meander resistor traces are electrically connected to respective pairs of the temperature sensing pins.

5. The planar power module of claim 4, wherein the parallel external conductive surfaces are constructed from direct bond copper (DBC), and wherein the copper meander resistor traces are etched onto the DBC.

6. The planar power module of claim 1, wherein the planar power module defines internal coolant passages in proximity to the semiconductor switching dies, and wherein the internal coolant passages are configured to direct a coolant through the planar power module to thereby cool the semiconductor switching dies.

7. The planar power module of claim 6, wherein the internal coolant passages are defined within the polymer molding material, such that the coolant passes through the internal coolant passages and does not directly contact the semiconductor switching dies.

8. The planar power module of claim 6, wherein the internal coolant passages have different diameters to provide an even flow rate of a coolant through the planar power module.

9. The planar power module of claim 1, wherein at least one of the semiconductor switching dies includes multiple semiconductor dies forming a single semiconductor switch.

10. An electric powertrain system comprising:
a polyphase electric machine having phase windings and an output member;
a battery pack; and
a traction power inverter module (TPIM) connected to the battery pack and to the phase windings of the polyphase rotary electric machine, the TPIM including a planar power module constructed as a full-bridge inverter circuit, and having:
a first substrate;
a second substrate arranged parallel to the first substrate, wherein the first substrate and the second substrate each respectively have a dielectric layer interposed between two conductive layers, such that one of the two conductive layers of each of the first substrate and the second substrate together form parallel external conductive surfaces of the planar power module;
direct current (DC) bus bars connected to the battery pack;
alternating current (AC) bus bars connected to the phase windings;
a plurality of semiconductor switching dies arranged between the first substrate and the second substrate, and electrically connected to the DC bus bars and the AC bus bars, wherein each respective one of the semiconductor switching dies is electrically connected to the two conductive layers of the first substrate or the second substrate; and
a polymer molding material surrounding the first substrate, the second substrate, and the plurality of semiconductor switching dies.

11. The electric powertrain system of claim 10, further comprising a double-sided cooling system within which the planar power module is disposed.

12. The electric powertrain system of claim 11, wherein the polyphase electric machine is a three-phase electric machine, and wherein the full-bridge inverter circuit is a three-phase full-bridge inverter circuit.

13. The electric powertrain system of claim 11, wherein the three-phase electric machine is a three-phase electric traction motor coupled to a driven load.

14. The electric powertrain system of claim 11, wherein the planar power module includes a first temperature sensor connected to a first one of the parallel external conductive surfaces, and a second temperature sensor connected to a second one of the parallel external conductive surfaces.

15. The electric powertrain system of claim 14, wherein the planar power module includes temperature sensing pins, the first temperature sensor and the second temperature sensor each include a respective pair of copper meander resistor traces, and the respective pair of copper meander resistor traces are electrically connected to respective pairs of the temperature sensing pins.

16. The electric powertrain system of claim 11, wherein the parallel external conductive surfaces are constructed from direct bond copper (DBC), and wherein the respective pair of copper meander resistor traces are etched onto the DBC.

17. The electric powertrain system of claim 11, wherein the planar power module defines internal coolant passages in proximity to the semiconductor switching dies to direct the coolant through the planar power module.

18. The electric powertrain system of claim 17, wherein the internal coolant passages are defined within the polymer molding material, such that the coolant passes through the internal coolant passages and does not directly contact the semiconductor switching dies.

19. The electric powertrain system of claim 17, wherein the internal coolant passages have different diameters to provide an even flow rate of a coolant through the planar power module.

20. A motor vehicle comprising:
a set of road wheels;
a three-phase electric traction motor having three phase windings and an output member, the output member being coupled to at least one of the road wheels;
a propulsion battery pack; and
a traction power inverter module (TPIM) connected to the propulsion battery pack and to the three phase windings of the three-phase electric traction motor, the TPIM including a double-sided cooling system and a planar power module positioned therewithin, the planar power module being configured as a three-phase full-bridge inverter circuit, and having:
a first substrate;
a second substrate arranged parallel to the first substrate, wherein the first substrate and the second substrate each respectively have a dielectric layer interposed between two conductive layers, such that one of the two conductive layers of each of the first substrate and the second substrate together form parallel external conductive surfaces of the power module;

direct current (DC) bus bars connected to the propulsion battery pack;

alternating current (AC) bus bars connected to the phase windings;

a plurality of semiconductor switching dies arranged between the first substrate and the second substrate, and electrically connected to the DC bus bars and the AC bus bars, wherein each respective one of the semiconductor switching dies is electrically connected to the two conductive layers of the first substrate or the second substrate; and a polymer molding material surrounding the first substrate, the second substrate, and the plurality of semiconductor switching dies, wherein the polymer molding material defines internal coolant passages in proximity to the semiconductor switching dies.

* * * * *